US012641977B2

(12) United States Patent　(10) Patent No.: US 12,641,977 B2

Hong et al.　(45) Date of Patent: May 26, 2026

(54) DISPLAY DEVICE

(71) Applicant: SAMSUNG DISPLAY CO., LTD., Yongin-si (KR)

(72) Inventors: Sang Min Hong, Cheonan-si (KR); Heeseong Jeong, Suwon-si (KR); Nari Heo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 882 days.

(21) Appl. No.: 17/809,285

(22) Filed: Jun. 28, 2022

(65) Prior Publication Data

US 2023/0102208 A1　Mar. 30, 2023

(30) Foreign Application Priority Data

Sep. 30, 2021　(KR) ........................ 10-2021-0129684

(51) Int. Cl.

| | |
|---|---|
| *H10K 59/35* | (2023.01) |
| *H10K 50/844* | (2023.01) |
| *H10K 59/12* | (2023.01) |
| *H10K 59/80* | (2023.01) |
| *H10K 102/00* | (2023.01) |

(52) U.S. Cl.

CPC ........... *H10K 59/35* (2023.02); *H10K 50/844* (2023.02); *H10K 59/8731* (2023.02); *H10K 59/8791* (2023.02); *H10K 59/12* (2023.02); *H10K 2102/351* (2023.02)

(58) Field of Classification Search

CPC ............. H10K 50/844; H10K 50/8445; H10K 50/858; H10K 59/12; H10K 59/35; H10K 59/873; H10K 59/8731; H10K 59/879; H10K 59/8791; H10K 2102/351

See application file for complete search history.

(56) References Cited

U.S. PATENT DOCUMENTS

| | | | |
|---|---|---|---|
| 10,896,939 B2 | 1/2021 | Jeon et al. | |
| 12,464,926 B2 * | 11/2025 | Motoyama | ........... H10K 59/121 |
| 2015/0137082 A1 * | 5/2015 | Kim | ........................ H10K 59/35 257/40 |

(Continued)

FOREIGN PATENT DOCUMENTS

| | | |
|---|---|---|
| KR | 10-2016-0083986 | 7/2016 |
| KR | 10-2016-0100026 A | 8/2016 |

(Continued)

OTHER PUBLICATIONS

Office Action dated Dec. 21, 2024, in corresponding Korean Patent Application No. 10-2021-0129684, 6 pages.

*Primary Examiner* — Shahed Ahmed

*Assistant Examiner* — E. Rhett Cheek

(74) *Attorney, Agent, or Firm* — F. CHAU & ASSOCIATES, LLC

(57) ABSTRACT

A display device includes a substrate, a light emitting diode disposed on the substrate and that emits light that has a preset color, a capping layer disposed on the light emitting diode and that has a thickness of about 540 angstroms to about 640 angstroms, and a thin film encapsulation layer disposed on the capping layer. As the capping layer has a predetermined thickness, a reflectance of external light is reduced, a color bleeding phenomenon is reduced, and the luminous efficiency of the light emitting diode is increased.

6 Claims, 6 Drawing Sheets

(56) References Cited

U.S. PATENT DOCUMENTS

| | | | | |
|---|---|---|---|---|
| 2016/0079567 A1* | 3/2016 | Cho | .................. | H10K 59/8731 |
| | | | | 257/40 |
| 2016/0197308 A1* | 7/2016 | Jeong | .................. | H10K 50/852 |
| | | | | 257/40 |
| 2016/0240589 A1 | 8/2016 | Jeong | | |
| 2016/0322602 A1* | 11/2016 | Jung | .................. | H10D 86/411 |
| 2017/0317316 A1* | 11/2017 | Yang | .................. | H10K 59/873 |
| 2018/0123068 A1* | 5/2018 | Ushikubo | ............ | H10K 50/852 |
| 2019/0043931 A1 | 2/2019 | Yim et al. | | |
| 2019/0123303 A1* | 4/2019 | Yasukawa | ............ | H10K 50/852 |
| 2022/0310974 A1* | 9/2022 | Zhou | .................. | H10K 59/879 |

FOREIGN PATENT DOCUMENTS

| | | |
|---|---|---|
| KR | 10-2018-0051702 | 6/2018 |
| KR | 10-2019-0015682 A | 2/2019 |
| KR | 10-2019-0074037 | 6/2019 |
| KR | 10-2020-0089379 | 7/2020 |

* cited by examiner

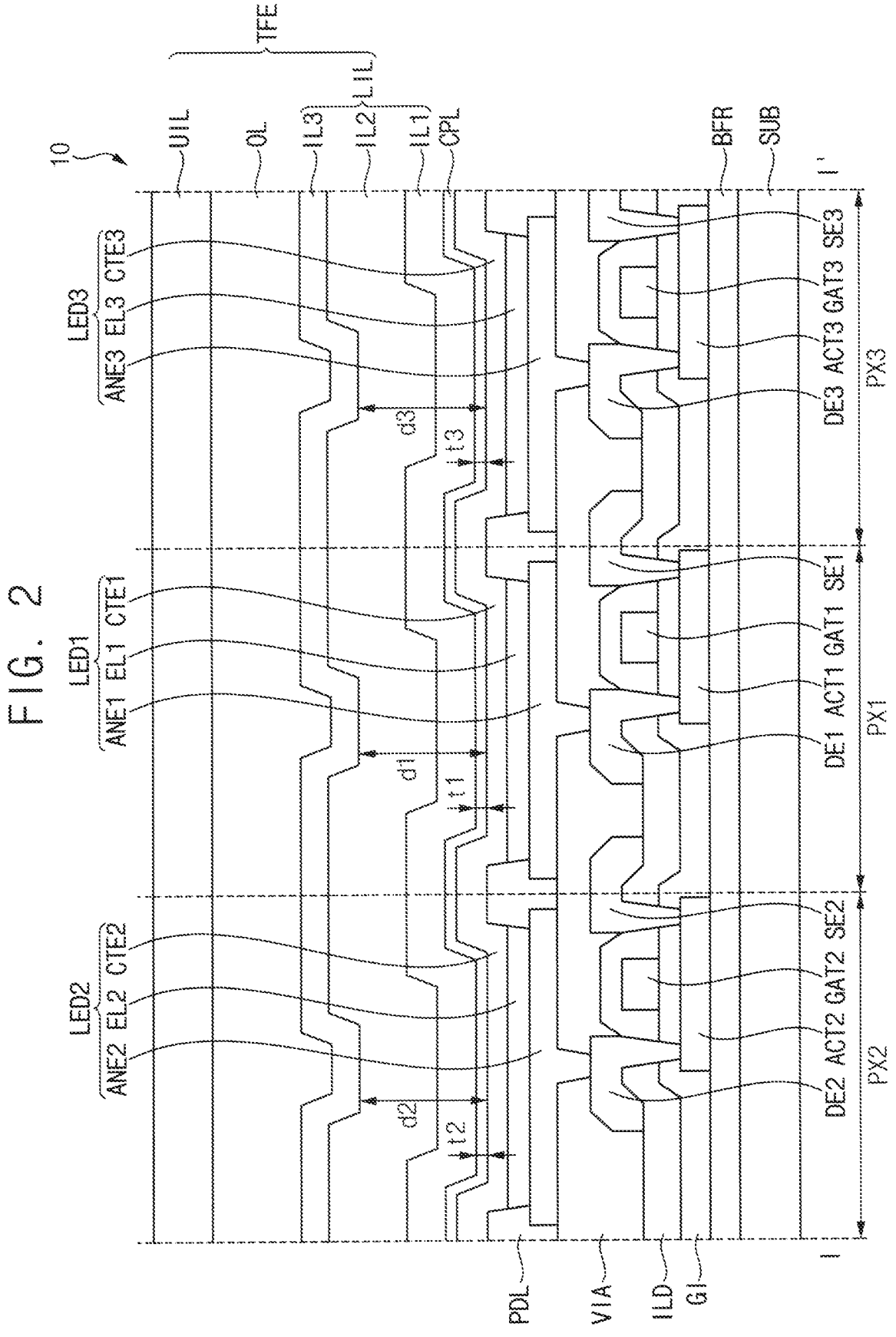
F I G. 2

F I G. 6
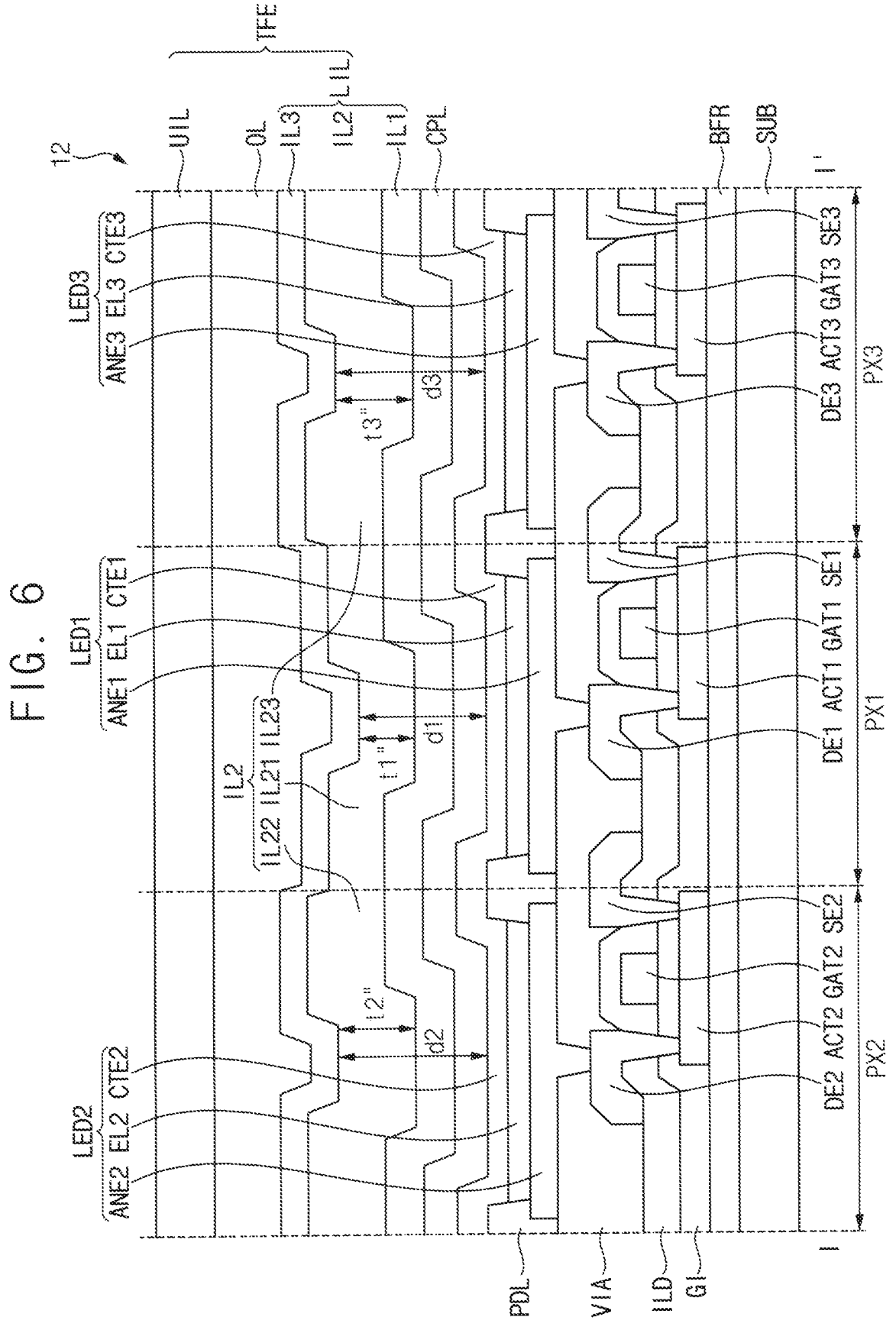

DISPLAY DEVICE

This application claims priority under 35 U.S.C. § 119 from Korean Patent Application No. 10-2021-0129684, filed on Sep. 30, 2021 in the Korean Intellectual Property Office, the contents of which are herein incorporated by reference in their entirety.

TECHNICAL FIELD

Embodiments of the inventive concept are directed to a display device. More specifically, embodiments of the inventive concept are directed to a display device with reduced color bleeding.

DISCUSSION OF THE RELATED ART

With advances in technology, smaller, lighter and higher performing display devices are being produced. Until recently, conventional CRT monitors have been widely used as display devices, due to good performance and reasonable prices. However, display devices that are smaller, lighter, more portable and use less power are attracting attention. For example, plasma display devices, liquid crystal display devices, organic light emitting display devices, quantum dot display devices, etc. are attracting attention. In recent years, display devices that hays high luminous efficiency and low reflectance of external light has been demanded.

SUMMARY

Embodiments provide a display device with increased display quality.

A display device according to an embodiment includes a substrate, a first light emitting diode disposed on the substrate and that emits light that has a first color, a first capping layer disposed on the first light emitting diode and that has a thickness of about 540 angstroms to about 640 angstroms, and a thin film encapsulation layer disposed on the first capping layer.

According to an embodiment, the first color is green.

According to an embodiment, the display device further includes a second light emitting diode disposed on the substrate, adjacent to the first light emitting diode, and that emits light that has a second color that differs from the first color. The first capping layer is further disposed on the second light emitting diode, and the first capping layer disposed on the second light emitting diode has a same thickness as the first capping layer disposed on the first light emitting diode.

According to an embodiment, the display device further includes a second light emitting diode disposed on the substrate, adjacent to the first light emitting diode, and that emits light that has a second color that differs from the first color, and a second capping layer disposed on the second light emitting diode and that has a thickness greater than the thickness of the first capping layer.

According to an embodiment, a refractive index of the first capping layer is equal to a refractive index of the second capping layer.

According to an embodiment, a refractive index of the first capping layer is about 2.

According to an embodiment, the thin film encapsulation layer includes a lower inorganic layer that includes a first inorganic layer, a second inorganic layer, and a third inorganic layer that are sequentially disposed on the first capping layer, an organic layer disposed on the lower inorganic layer, and an upper inorganic layer disposed on the organic layer.

A display device according to an embodiment includes a substrate, a first light emitting diode disposed on the substrate and that emits light that has a first color, a second light emitting diode disposed on the substrate, adjacent to the first light emitting diode, and that emits light that has a second color that differs from the first color, a first capping layer disposed on the first light emitting diode, and a second capping layer disposed on the second light emitting diode and adjacent to the first capping layer. A first thickness of the first capping layer is less than a second thickness of the second capping layer.

According to an embodiment, the first color is green.

According to an embodiment, the first thickness is about 85% of the second thickness.

According to an embodiment, the first thickness is about 540 angstroms to about 640 angstroms.

According to an embodiment, a refractive index of the first capping layer is a same as a refractive index of the second capping layer.

According to an embodiment, a refractive index of the first capping layer is about 2.

A display device according to an embodiment includes a substrate, a first light emitting diode disposed on the substrate and that emits light that has a first color, a second light emitting diode disposed on the substrate, adjacent to the first light emitting diode, and that emits light that has a second color that differs from the first color, a capping layer disposed on the first light emitting diode and the second light emitting diode, and a thin film encapsulation layer that includes a lower organic layer disposed on the capping layer. The lower inorganic layer includes a first inorganic layer, a second inorganic layer, and a third inorganic layer that are sequentially disposed on the capping layer. A distance from an upper surface of the first light emitting diode to an upper surface of the second inorganic layer is less than a distance an upper surface of the second light emitting diode to an upper surface of the second inorganic layer.

According to an embodiment, a first thickness of the second inorganic layer that overlaps the first light emitting diode is less than a second thickness of the second inorganic layer that overlaps the second light emitting diode.

According to an embodiment, the first thickness is about 85% of the second thickness.

According to an embodiment, the second thickness is about 10000 angstroms.

According to an embodiment, a second refractive index of the second inorganic layer is greater than a first refractive index of the first inorganic layer and a third refractive index of the third inorganic layer.

According to an embodiment, the third refractive index is greater than the first refractive index.

According to an embodiment, the thin film encapsulation layer includes an organic layer disposed on the lower inorganic layer, and an upper inorganic layer disposed on the organic layer. The lower inorganic layer includes silicon oxynitride, and the upper inorganic layer includes silicon nitride.

BRIEF DESCRIPTION OF THE DRAWINGS

FIG. 2 is a cross-sectional view taken along line I-I' of FIG. 1.

FIG. 6 is a cross-sectional view of a display device according to an embodiment.

DETAILED DESCRIPTION

Illustrative, non-limiting embodiments will be more clearly understood from the following detailed description in conjunction with the accompanying drawings.

The term "about" or "substantially" as used herein is inclusive of the stated value and means within an acceptable range of deviation for the particular value as determined by one of ordinary skill in the art, considering the measurement in question and the error associated with measurement of the particular quantity, such as the limitations of the measurement system. For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Figure 1:
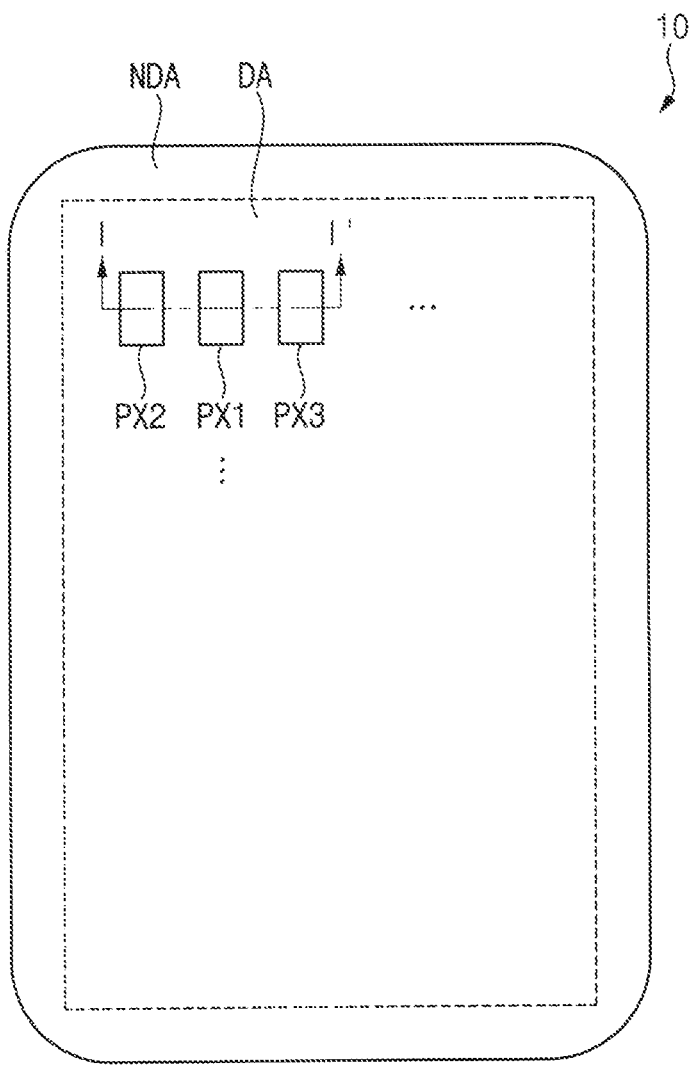
FIG. 1 is a plan view of a display device according to an embodiment.

FIG. 1 is a plan view of a display device according to an embodiment.

Referring to FIG. 1, a display device 10 according to an embodiment includes a plurality of pixels. For example, the display device 10 includes a first pixel PX1, a second pixel PX2, and a third pixel PX3.

The first pixel PX1, the second pixel PX2, and the third pixel PX3 are disposed in a display area DA of the display device 10. A non-display area NDA of the display device 10 surrounds the display area DA. A driver is disposed in the non-display area NDA. The driver provides signals and/or voltages to the first pixel PX1, the second pixel PX2, and the third pixel PX3. For example, the driver includes a gate driver, a data driver, etc.

The first pixel PX1 emits light that has a first color, the second pixel PX2 emits light that has a second color, and the third pixel PX3 emits light that has a third color. By combining the first color light, the second color light, and the third color light, the display device 10 can display an image.

In an embodiment, the first color is green. For example, light of the first color has a wavelength band of about 490 nm to about 570 nm.

In an embodiment, the second color is red, and the third color is blue. For example, the second color light has a wavelength band of about 630 nm to about 750 nm, and the third color light has a wavelength band of about 450 nm to about 490 nm. However, embodiments of the present disclosure are not limited to the second color being red or the third color being blue.

FIG. 2 is a cross-sectional view taken along line I-I' of FIG. 1.

Referring to FIG. 2, in an embodiment, the display device 10 includes a substrate SUB, a buffer layer BFR, first to third active patterns ACT1, ACT2, and ACT3, a gate insulating layer GI, first to third gate electrodes GAT1, GAT2, and GAT3, an interlayer insulating layer ILD, first to third source electrodes SE1, SE2, and SE3, first to third drain electrodes DE1, DE2, and DE3, a via insulating layer VIA, a first light emitting diode LED1, a second light emitting diode LED2, a third light emitting diode LED3, a pixel defining layer PDL, a capping layer CPL, and a thin film encapsulation layer TFE.

In an embodiment, the substrate SUB is a flexible substrate formed of polyimide, etc. The flexible substrate has a structure in which polyimide layers and barrier layers are alternately stacked. In an embodiment, the substrate SUB is a rigid substrate formed of quartz, synthetic quartz, calcium fluoride, fluorine-doped quartz, soda lime, glass, or alkali-free glass, etc. These may be used alone or in combination with each other.

The buffer layer BFR is disposed on the substrate SUB. The buffer layer BFR prevents diffusion of metal atoms or impurities from the substrate SUB into the first to third active patterns ACT1, ACT2, and ACT3. The buffer layer BFR controls a rate of heat supply during a crystallization process of forming the first to third active patterns ACT1, ACT2, and ACT3. Examples of a material that can be used for the buffer layer BFR include silicon oxide, silicon nitride, silicon oxynitride, etc. These may be used alone or in combination with each other.

The first active pattern ACT1 is disposed on the buffer layer BFR. The first active pattern ACT1 includes a silicon semiconductor or an oxide semiconductor. Examples of a silicon semiconductor include amorphous silicon and polycrystalline silicon. The second active pattern ACT2 and the third active pattern ACT3 are formed together with the first active pattern ACT1 and include substantially the same material as the first active pattern ACT1.

The gate insulating layer GI is disposed on the buffer layer BFR and the first to third active patterns ACT1, ACT2, and ACT3, and covers the first to third active patterns ACT1, ACT2, and ACT3. The gate insulating layer GI includes an inorganic insulating material. Examples of an inorganic insulating material include silicon oxide, silicon nitride, and silicon oxynitride. These may be used alone or in combination with each other.

The first gate electrode GAT1 is disposed on the gate insulating layer GI. The first gate electrode GAT1 overlaps the first active pattern ACT1. The first gate electrode GAT1 includes at least one of a metal, a metal oxide, or a metal nitride. Examples of a metal include silver, molybdenum, aluminum, tungsten, copper, nickel, chromium, titanium, tantalum, platinum, and scandium. These may be used alone or in combination with each other. Examples of a metal oxide include indium tin oxide ("ITO"), indium zinc oxide ("IZO"), etc. These may be used alone or in combination with each other. Examples of a metal nitride include aluminum nitride, tungsten nitride, and chromium nitride. These may be used alone or in combination with each other. The second gate electrode GAT2 overlaps the second active pattern ACT2, and the third gate electrode GAT3 overlaps the third active pattern ACT3. The second gate electrode GAT2 and the third gate electrode GAT3 are formed together with the first gate electrode GAT1 and include substantially the same material as the first gate electrode GAT1.

The interlayer insulating layer ILD is disposed on the gate insulating layer GI and the first to third gate electrodes GAT1, GAT2, and GAT3, and covers the first to third gate electrodes GAT1, GAT2, and GAT3. The interlayer insulating layer ILD includes an inorganic insulating material.

The first source electrode SE1, the first drain electrode DE1, the second source electrode SE2, the second drain electrode DE2, the third source electrode SE3 and the third drain electrode DE3 are disposed on the interlayer insulating layer ILD. The first source electrode SE1 and the first drain electrode DE1 are connected to the first active pattern ACT1 through a contact hole. Each of the first source electrode SE1 and the first drain electrode DE1 may include at least one of a metal, a metal oxide, or a metal nitride, etc. The second source electrode SE2 and the second drain electrode DE2 are connected to the second active pattern ACT2 through a contact hole, and the third source electrode SE3 and the third drain electrode DE3 are connected to the third active pattern ACT3 through a contact hole. The second source electrode SE2, the second drain electrode DE2, the third source electrode SE3, and the third drain electrode DE3 are formed together with the first source electrode SE1 and the first drain electrode DE1, and include substantially the same material as the first source electrode SE1 and the first drain electrode DEL The via insulating layer VIA is disposed on the interlayer insulating layer ILD, the first to third source electrodes SE1, SE2, and SE3 and the first to third drain electrodes DE1, DE2, and DE3. The via insulating layer VIA covers the first to third source electrodes SE1, SE2, and SE3 and the first to third drain electrodes DE1, DE2, and DE3. The via insulating layer VIA has a substantially flat upper surface. The via insulating layer VIA includes an organic insulating material. Examples of an organic insulating material include photoresists, polyacrylic resins, and polyimide resins. These may be used alone or in combination with each other.

The first light emitting diode LED1 include a first pixel electrode ANE1, a first intermediate layer EL1, and a first common electrode CTE1. The second light emitting diode LED2 includes a second pixel electrode ANE2, a second intermediate layer EL2, and a second common electrode CTE2. The third light emitting diode LED3 includes a third pixel electrode ANE3, a third intermediate layer EL3, and a third common electrode CTE3.

The first pixel electrode ANE1 is disposed on the via insulating layer VIA. The first pixel electrode ANE1 is connected to the first drain electrode DE1 through a contact hole. The first pixel electrode ANE1 includes at least one of a metal, a metal oxide, or a metal nitride. The second pixel electrode ANE2 is connected to the second drain electrode DE2 through a contact hole, and the third pixel electrode ANE3 is connected to the third drain electrode DE3 through a contact hole. The second pixel electrode ANE2 and the third pixel electrode ANE3 are formed together with the first pixel electrode ANE1 and include substantially the same material as the first pixel electrode ANE1.

The pixel defining layer PDL is disposed on the via insulating layer VIA. The pixel defining layer PDL exposes the first to third pixel electrodes ANE1, ANE2, and ANE3 through respective pixel openings. The pixel defining layer PDL covers ends of each of the first to third pixel electrodes ANE1, ANE2, and ANE3. The pixel defining layer PDL includes an organic insulating material.

The first intermediate layer EL1 is disposed on the first pixel electrode ANE1. The second intermediate layer EL2 is disposed on the second pixel electrode ANE2. The third intermediate layer EL3 is disposed on the third pixel electrode ANE3. Each of the first to third intermediate layers EL1, EL2, and EL3 are disposed in the pixel openings, respectively. Each of the first to third intermediate layers EL1, EL2, and EL3 includes an organic material that emits light of a preset color. The organic material emits light based on a potential difference between each of the first to third pixel electrodes ANE1, ANE2 and ANE3 and each of the first to third common electrodes CTE1, CTE2, and CTE3, respectively In an embodiment, the first intermediate layer EL1 includes a first organic material that emits green light. In addition, the first intermediate layer EL1 may further include a hole injection layer, a hole transport layer, a light emitting layer, an electron transport layer, and an electron injection layer.

In an embodiment, the second intermediate layer EL2 includes a second organic material that emits red light, and the third intermediate layer EL3 includes a third organic material that emits blue light.

The first common electrode CTE1 is disposed on the first intermediate layer ELL The second common electrode CTE2 is disposed on the second intermediate layer EL2. The third common electrode CTE3 is disposed on the third intermediate layer EL3. The first to third common electrodes CTE1, CTE2, and CTE3 cover the pixel defining layer PDL. The first to third common electrodes CTE1, CTE2, and CTE3 include a transparent conductive material. The first to third common electrodes CTE1, CTE2, and CTE3 are integrally formed.

Each of the first to third light emitting diodes LED1, LED2, and LED3 has been described as including each of the first to third pixel electrodes ANE1, ANE2, and ANE3, each of the first to third intermediate layers EL1, EL2, and EL3, and each of the first to third common electrodes CTE1, CTE2, and CTE3, respectively, but embodiments of the present disclosure are not limited thereto. In embodiment, each of the first to third light emitting diodes LED1, LED2, and LED3 may be a micro light emitting diode ("micro-LED"), a nano light emitting diode ("nano-LED"), a quantum dot ("QD"), or a quantum rod ("QR").

The capping layer CPL is disposed on the first to third common electrodes CTE1, CTE2, and CTE3. The capping layer CPL is conformally formed along the profiles of the first to third common electrodes CTE1, CTE2, and CTE3.

The capping layer CPL resonates light emitted from the first to third intermediate layers EL1, EL2, and EL3. In an embodiment, a refractive index of the capping layer CPL is about 2. The capping layer CPL has constant thicknesses t1, t2, and t3 on the first to third common electrodes CTE1, CTE2, and CTE3. In an embodiment, a first thickness t1 of the capping layer CPL that overlaps the first light emitting diode LED1, a second thickness t2 of the capping layer CPL that overlaps the second light emitting diode LED2, and a third thickness t3 of the capping layer CPL that overlaps the light emitting diode LED3 are substantially equal to each other. In other words, the capping layer CPL is disposed on the first light emitting diode LED1, the second light emitting diode LED2, and the third light emitting diode LED3, and the capping layer CPL disposed on the first light emitting diode LED1, the second light emitting diode LED2, and the third light emitting diode LED3 has constant thicknesses t1, t2, and t3.

In an embodiment, the constant thicknesses t1, t2, and t3 of the capping layer CPL are about 540 angstroms to about 640 angstroms. If the capping layer CPL has a thickness of about 540 angstroms or more, reflectance of external light is reduced. In addition, if the capping layer CPL has a thickness of about 640 angstroms or less, the luminous efficiency of the first to third light emitting diodes LED1, LED2, and LED3 is increased. Accordingly, as the capping layer CPL has a constant thickness of about 540 angstroms to about 640 angstroms, the display quality of the display device 10 can be increased.

When the capping layer CPL has a thickness of less than about 540 angstroms, the luminous efficiency of the first to third light emitting diodes LED1, LED2, and LED3 do not substantially increase. In addition, when the capping layer CPL has a thickness greater than about 640 angstroms, the reflectance of the external light increases. As the reflectance of external light increases, color bleeding can occur. Accordingly, when the capping layer CPL has a thickness of less than about 540 angstroms or greater than about 640 angstroms, the display quality of the display device 10 deteriorates.

The thin film encapsulation layer TFE is disposed on the capping layer CPL. The thin film encapsulation layer TFE protects the first to third light emitting diodes LED1, LED2, and LED3 from external moisture, heat, impact, etc. The thin film encapsulation layer TFE includes a lower inorganic layer LIL, an organic layer OL, and an upper inorganic layer UIL.

The lower inorganic layer LIL is disposed on the capping layer CPL. The lower inorganic layer LIL includes silicon oxynitride ("SiOxNy"). The lower inorganic layer LIL includes a first inorganic layer IL1, a second inorganic layer IL2, and a third inorganic layer IL3 that are sequentially disposed on the capping layer CPL. Each of the first inorganic layer IL1, the second inorganic layer IL2, and the third inorganic layer IL3 has a different refractive index that depends on an oxygen content of the silicon oxynitride.

The first inorganic layer IL1 is disposed on the capping layer CPL. The first refractive index of the first inorganic layer IL1 is about 1.5 to about 1.6. For example, the first refractive index is about 1.57. The thickness of the first inorganic layer IL1 is about 1200 angstroms.

The second inorganic layer IL2 is disposed on the first inorganic layer ILL The second refractive index of the second inorganic layer IL2 is about 1.7 to about 1.8. For example, the second refractive index is about 1.77. The thickness of the second inorganic layer IL2 is about 10000 angstroms.

The third inorganic layer IL3 is disposed on the second inorganic layer IL2. The third refractive index of the third inorganic layer IL3 is about 1.6 to about 1.7. For example, the third refractive index is about 1.62. The thickness of the third inorganic layer IL3 is about 700 angstroms.

In an embodiment, a distance d1 from an upper surface of the first light emitting diode LED1 to an upper surface of the second inorganic layer IL2 is substantially the same as a distance d2 from an upper surface of the second light emitting diode LED2 to the upper surface of the second inorganic layer IL2. In addition, the distance d1 from the upper surface of the first light emitting diode LED1 to the upper surface of the second inorganic layer IL2 is substantially the same as a distance d3 from an upper surface of the third light emitting diode LED3 to the upper surface of the second inorganic layer IL2. In addition, the distance d2 from the upper surface of the second light emitting diode LED2 to the upper surface of the second inorganic layer IL2 is substantially the same as the distance d3 from the upper surface of the third light emitting diode LED3 to the upper surface of the second inorganic layer IL2

The lower inorganic layer LIL has a three-layer stacked structure that includes the first inorganic layer IL1, the second inorganic layer IL2, and the third inorganic layer IL3. Since the lower inorganic layer LIL has a three-layer stacked structure with alternating refractive indices, color changes according to a viewing angle are reduced.

The organic layer OL is disposed on the lower inorganic layer LIL. The organic layer OL has a substantially flat upper surface. Examples of an organic material included in the organic layer OL include a photoresist, a polyacrylic resin, a polyimide-based resin, an epoxy-based resin, and an acrylate-based resin. These may be used alone or in combination with each other. The organic layer OL has a thickness that is greater than each of a thickness of the lower inorganic layer LIL and a thickness of the upper inorganic layer UIL. For example, the thickness of the organic layer OL is about 88,000 angstroms.

The upper inorganic layer UIL is disposed on the organic layer OL. The upper inorganic layer UIL includes silicon nitride ("SiNx"). The refractive index of the upper inorganic layer UIL is about 1.8 to about 1.9. For example, the refractive index of the upper inorganic layer UIL is about 1.89. The thickness of the upper inorganic layer UIL is about 5000 angstroms.

In addition, in an embodiment, the display device 10 further includes a touch sensing layer and a color filter layer disposed on the thin film encapsulation layer TFE. The touch sensing layer is an input means of the display device 10. The color filter layer includes a first color filter, a second color filter, and a third color filter. The first color filter overlaps the first light emitting diode LED1. The first color filter transmits green light and blocks light having a color different from green. For example, the first color filter transmits light in a wavelength band of about 490 nm to about 570 nm. The second color filter transmits red light and blocks light of a color different from red. For example, the second color filter transmits light in a wavelength band of about 630 nm to about 750 nm. The third color filter transmits blue light and blocks light of a color different from blue. For example, the third color filter transmits light in a wavelength band of about 450 nm to about 490 nm.

Figure 3:
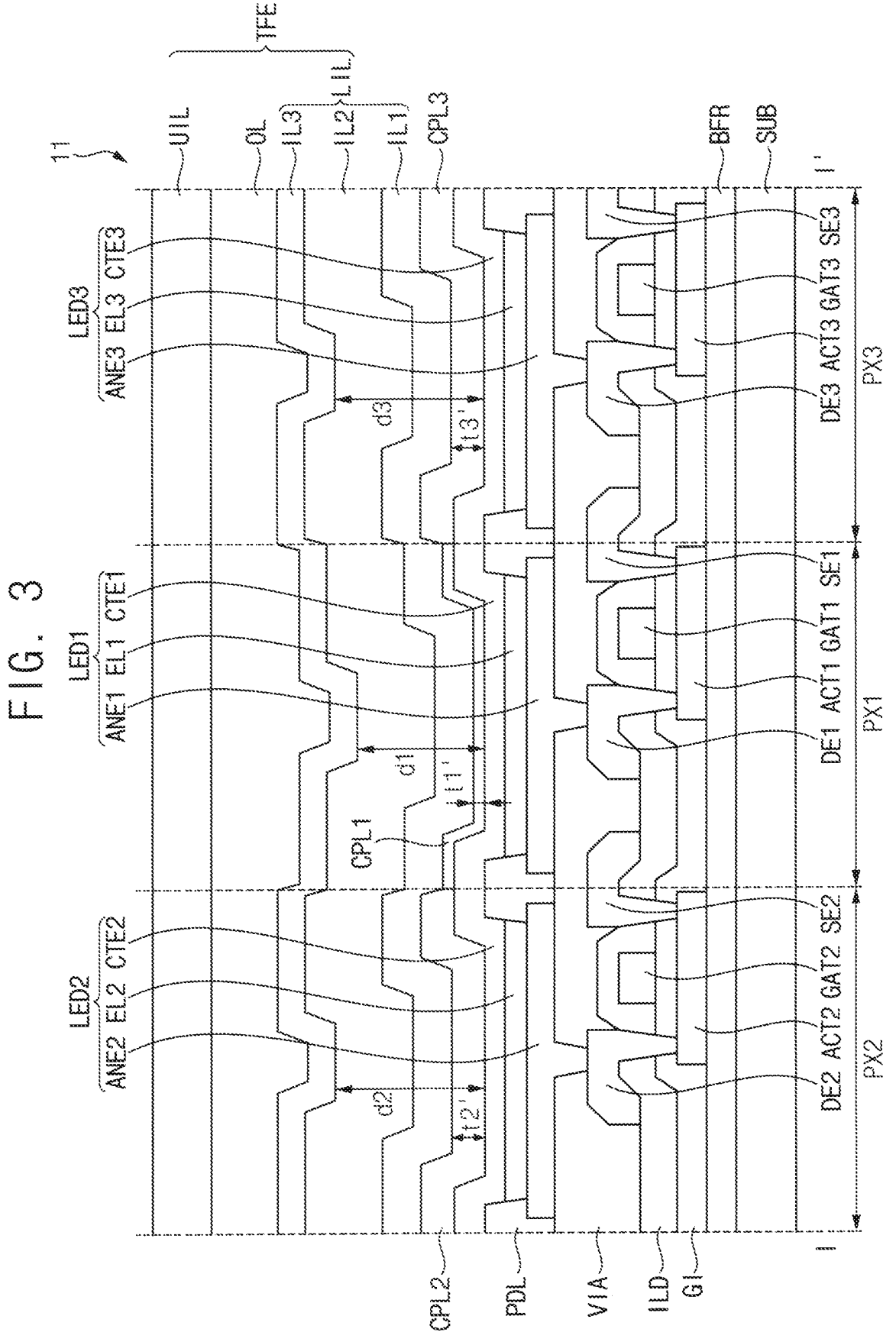
FIG. 3 is a cross-sectional view of a display device according to an embodiment.

FIG. 3 is a cross-sectional view of a display device according to an embodiment.

Referring to FIG. 3, a display device 11 according to an embodiment is substantially the same as the display device 10 described with reference to FIG. 2, except for a first capping layer CPL1, a second capping layer CPL2, and a third capping layer CPL3. Accordingly, a repeated description of other components will be omitted.

The display device 11 includes the substrate SUB, the buffer layer BFR, the first to third active patterns ACT1, ACT2, and ACT3, the gate insulating layer GI, the first to third gate electrodes GAT1, GAT2, and GAT3, the interlayer insulating layer ILD, the first to third source electrodes SE1, SE2, and SE3, the first to third drain electrodes DE1, DE2, and DE3, the via insulating layer VIA, the first light emitting diode LED1, the second light emitting diode LED2, the third light emitting diode LED3, the pixel defining layer PDL, the first capping layer CPL1, the second capping layer CPL2, the third capping layer CPL3, and the thin film encapsulation layer TFE.

The first capping layer CPL1 is disposed on the first common electrode CTE1. The first capping layer CPL1 overlaps the first common electrode CTE1. The first capping layer CPL1 is conformally formed along a profile of the first common electrode CTE1. The first capping layer CPL1 has a first thickness t1'.

The second capping layer CPL2 is disposed on the second common electrode CTE2. The second capping layer CPL2 overlaps the second common electrode CTE2. The second capping layer CPL2 is conformally formed along a profile of the second common electrode CTE2. The second capping layer CPL2 has a second thickness t2'.

The third capping layer CPL3 is disposed on the third common electrode CTE3. The third capping layer CPL3 overlaps the third common electrode CTE3. The third capping layer CPL3 is conformally formed along a profile of the third common electrode CTE3. The third capping layer CPL3 has a third thickness t3'.

The first to third capping layers CPL1, CPL2, and CPL3 include substantially the same material. The refractive indices of the first to third capping layers CPL1, CPL2, and CPL3 are substantially equal to each other. In an embodiment, the refractive index of each of the first to third capping layers CPL1, CPL2, and CPL3 is about 2.

The first inorganic layer IL1 is disposed on the first to third capping layers CPL1, CPL2, and CPL3, and has a constant thickness. The second inorganic layer IL2 is disposed on the first inorganic layer IL1 and has a constant thickness.

The first refractive index of the first inorganic layer IL1 is about 1.5 to 1.6. For example, the first refractive index of the first inorganic layer IL1 is about 1.57.

The second inorganic layer IL2 is disposed on the first inorganic layer ILL. The second refractive index of the second inorganic layer IL2 is about 1.7 to about 1.8. For example, the second refractive index of the second inorganic layer IL2 is about 1.77.

The third inorganic layer IL3 is disposed on the second inorganic layer IL2. The third refractive index of the third inorganic layer IL3 is about 1.6 to about 1.7. For example, the third refractive index of the third inorganic layer IL3 is about 1.62.

In an embodiment, a first distance d1 from an upper surface of the first light emitting diode LED1 to an upper surface of the second inorganic layer IL2 is less than a second distance d2 from an upper surface of the second light emitting diode LED2 to the upper surface of the second inorganic layer IL2. The first distance d1 from the upper surface of the first light emitting diode LED1 to the upper surface of the second inorganic layer IL2 is less than a third distance d3 from an upper surface of the third light emitting diode LED3 to the upper surface of the second inorganic layer IL2. For example, the second distance d2 from the upper surface of the second light emitting diode LED2 to the upper surface of the second inorganic layer IL2 is substantially equal to the third distance d3 from the upper surface of the third light emitting diode LED3 to the upper surface of the second inorganic layer IL2.

In an embodiment, the first thickness t1' is less than the second thickness t2'. The first thickness t1' is about 85% of the second thickness t2'. The first thickness t1' is less than the third thickness t3'. The first thickness t1' is about 85% of the third thickness t3'. For example, the second thickness t2' is substantially equal to the third thickness t3'.

In an embodiment, the first thickness t1' is between about 540 angstroms and about 640 angstroms. In detail, the first thickness t1' is about 540 angstroms, and each of the second thickness t2' and the third thickness t3' is about 640 angstroms.

In detail, the first thickness t1' of the first capping layer CPL1 disposed on the first light emitting diode LED1 that emits green light is less than the second thickness t2' of the second capping layer CPL2 disposed on the second light emitting diode LED2 that emits red light, and is less than third thickness t3' of the third capping layer CPL3 disposed on the third light emitting diode LED3 that emits blue light.

Since the first capping layer CPL1 has a first thickness t1' of about 530 angstroms to about 640 angstroms, reflectance of external light is reduced in a region where green light is emitted. For example, a bleeding phenomenon of green light caused by reflection of the external light is reduced. Accordingly, a display quality of the display device 11 is increased.

Figure 4:
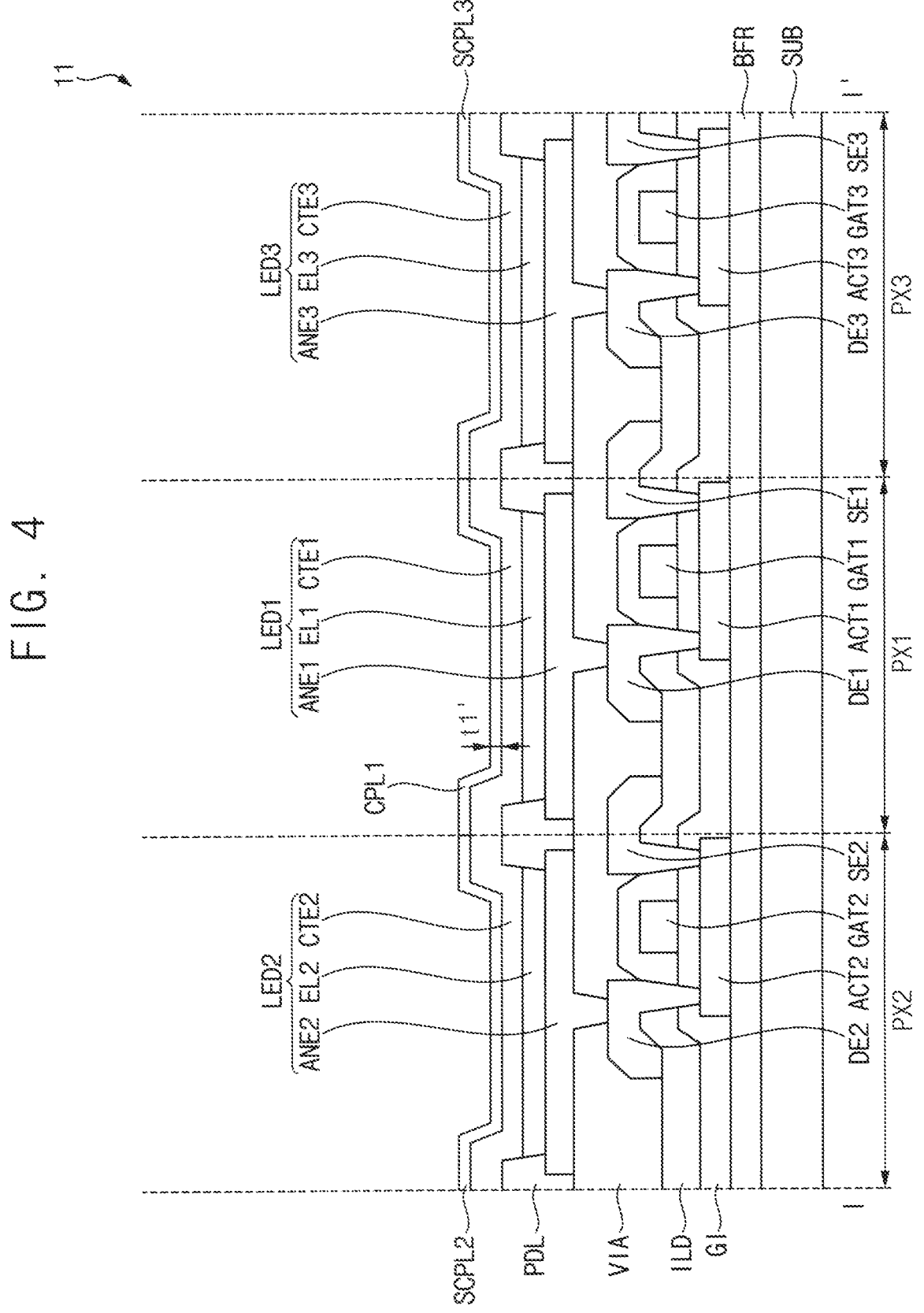
FIG. 4 and FIG. 5 are cross-sectional views that illustrate a method of manufacturing a display device of FIG. 3.
Figure 5:
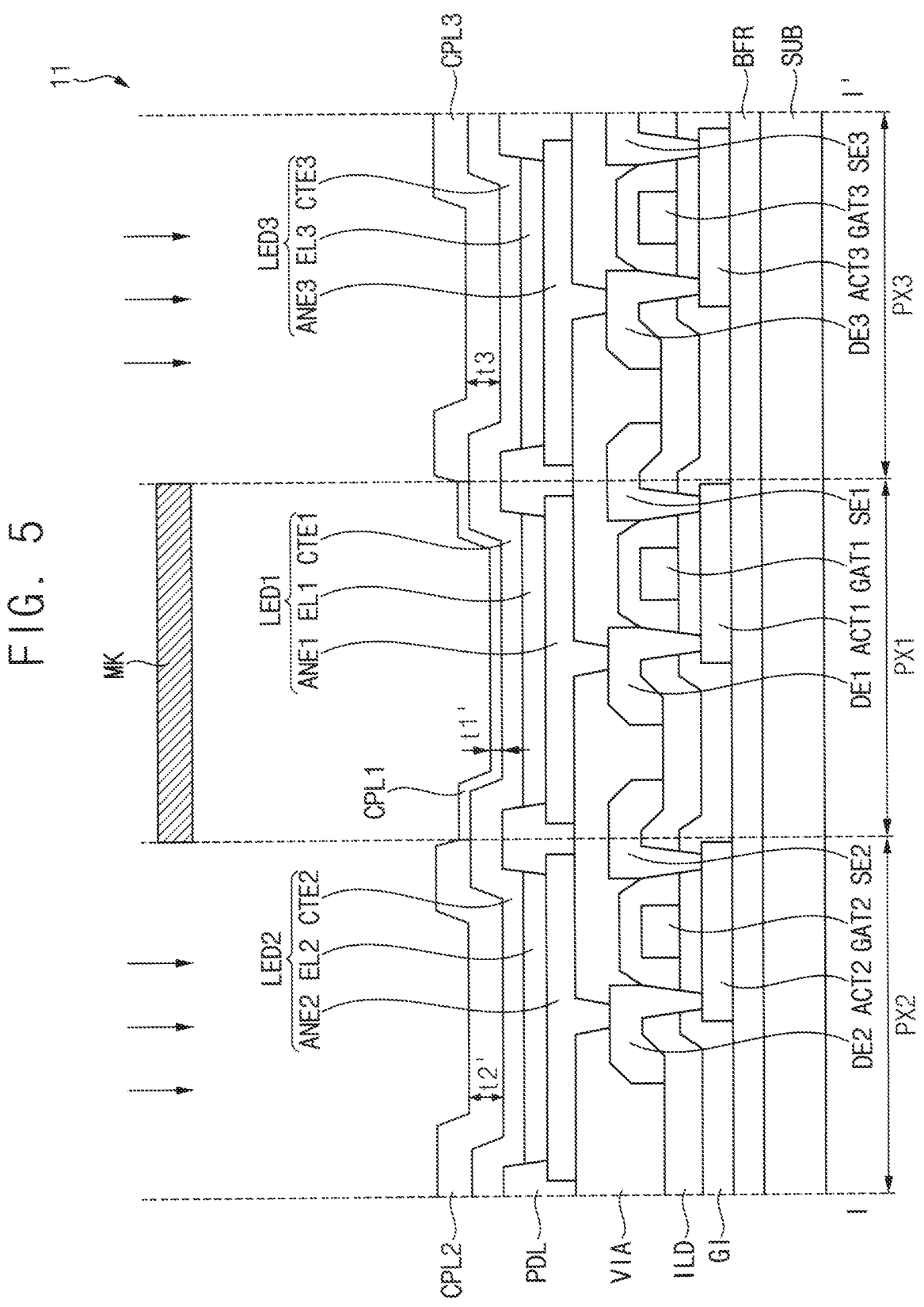

FIG. 4 and FIG. 5 are cross-sectional views that illustrate a method of manufacturing a display device of FIG. 3.

Referring to FIGS. 3 and 4, in an embodiment, a first capping layer CPL1, a second preliminary capping layer SCPL2, and a third preliminary capping layer SCPL3 are formed together. For example, the first capping layer CPL1, the second preliminary capping layer SCPL2, and the third preliminary capping layer SCPL3 are deposited using an open mask that has an opening that corresponds to the display area DA. Accordingly, the first capping layer CPL1, the second preliminary capping layer SCPL2, and the third preliminary capping layer SCPL3 each have substantially the same first thickness t1'.

Referring to FIG. 5, in an embodiment, a second capping layer CPL2 and a third capping layer CPL3 are formed. For example, the second capping layer CPL2 and the third capping layer CPL3 are deposited using a fine metal mask MK that has openings that correspond to the second and third pixels PX2 and PX3. Accordingly, the second capping layer CPL2 has the second thickness t2' greater than the first thickness t1', and the third capping layer CPL3 has the third thickness t3' greater than the first thickness t1'. In addition, the second thickness t2' of the second capping layer CPL2 is substantially equal to the third thickness t3' of the third capping layer CPL3.

FIG. 6 is a cross-sectional view of a display device according to an embodiment.

Referring to FIG. 6, a display device 12 according to an embodiment is substantially the same as the display device 10 described with reference to FIG. 2, except for a second inorganic layer IL2. Accordingly, repeated descriptions of other components will be omitted.

The display device 12 includes the substrate SUB, the buffer layer BFR, the first to third active patterns ACT1, ACT2, and ACT3, the gate insulating layer GI, the first to third gate electrodes GAT1, GAT2, and GAT3, the interlayer insulating layer ILD, the first to third source electrodes SE1, SE2, and SE3, the first to third drain electrodes DE1, DE2, and DE3, the via insulating layer VIA, the first light emitting diode LED1, the second light emitting diode LED2, the third light emitting device LED3, the pixel defining layer PDL, the capping layer CPL, and a thin film encapsulation layer TFE.

The capping layer CPL is disposed on the first to third common electrodes CTE1, CTE2, and CTE3. The capping layer CPL is conformally formed along the profiles of the first to third common electrodes CTE1, CTE2, and CTE3. The capping layer CPL has a constant thickness. For example, the constant thickness of the capping layer CPL is about 640 angstroms.

The first inorganic layer IL1 is disposed on the capping layer CPL. The first inorganic layer IL1 has a constant thickness.

The second inorganic layer IL2 is disposed on the first inorganic layer ILL. The second inorganic layer IL2 includes a first portion IL21, a second portion IL22, and a third portion IL23. The first portion IL21 overlaps the first light emitting diode LED1. The second portion IL22 overlaps the second light emitting diode LED2. The third portion IL23 overlaps the third light emitting diode LED3. The second inorganic layer IL2 has a non-uniform thickness.

In an embodiment, a first distance d1 from an upper surface of the first light emitting diode LED1 to an upper surface of the second inorganic layer IL2 is less than a second distance d2 from an upper surface of the second light emitting diode LED2 to the upper surface of the second inorganic layer IL2. The first distance d1 from the upper surface of the first light emitting diode LED1 to the upper surface of the second inorganic layer IL2 is less than a third distance d3 from an upper surface of the third light emitting diode LED3 to the upper surface of the second inorganic layer IL2. For example, the second distance d2 from the upper surface of the second light emitting diode LED2 to the upper surface of the second inorganic layer IL2 is substantially equal to the distance d3 from the upper surface of the third light emitting diode LED3 to the upper surface of the second inorganic layer IL2.

In an embodiment, a first thickness t1" of the first portion IL21 is less than a second thickness t2" of the second portion IL22. The first thickness t1" is about 85% of the second thickness t2". The first thickness t1" of the first portion IL21 is less than a third thickness t3" of the third portion IL23. The first thickness t1" is about 85% of the third thickness t3". For example, the second thickness t2" is substantially equal to the third thickness t3".

In an embodiment, the first thickness t1" is between about 8500 angstroms and about 10,000 angstroms. In detail, the first thickness t1" is about 8500 angstroms, and each of the second thickness t2" and the third thickness t3" is about 10,000 angstroms.

In detail, the first thickness t1" of the first portion IL21 disposed on the first light emitting diode LED1 that emits green light is less than the second thickness t2" of the second portion IL22 disposed on the second light emitting diode LED2 that emits red light, and is less than the third thickness t3" of the third portion IL33 disposed on the third light emitting diode LED3 that emits blue light.

Since the second inorganic layer IL2 has a first thickness t1" of about 8500 angstroms to about 10000 angstroms in a region that overlaps the first light emitting diode LED1 that emits green light, a reflectance of external light in the region where green light is emitted is reduced. For example, a bleeding phenomenon of green color caused by reflection of the external light is reduced. Accordingly, a display quality of the display device 12 is increased.

According to an embodiment, a capping layer disposed on a light emitting diode has a thickness of about 540 angstroms to about 640 angstroms. Accordingly, a reflectance of external light is reduced, and a luminous efficiency of the light emitting diode is increased.

In addition, a thickness of the capping layer disposed on the light emitting diode that emits green light is less than a thickness of the capping layer disposed on the light emitting diode that emits light of a color different from green. Since the reflectance of external light is reduced in the area where the green light is emitted, a green color bleeding phenomenon caused by the reflection of the external light is reduced.

Although certain embodiments and implementations have been described herein, other embodiments and modifications will be apparent from this description. Accordingly, embodiments of the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a substrate;
a first light emitting diode disposed on the substrate and that emits green light;
a second light emitting diode disposed on the substrate, adjacent to the first light emitting diode, and that emits red light;
a third light emitting diode disposed on the substrate, adjacent to the first light emitting diode, and that emits blue light;
a first capping layer disposed on the first light emitting diode;
a second capping layer disposed on the second light emitting diode and adjacent to the first capping layer; and
a third capping layer disposed on the third light emitting diode and adjacent to the first capping layer,
wherein a first thickness of the first capping layer is less than a second thickness of the second capping layer, and
wherein the first thickness is less than a third thickness of the third capping layer.

2. The display device of claim 1, further comprising:
a thin film encapsulation layer disposed on the first capping layer, the second capping layer, and the third capping layer, wherein the thin film encapsulation layer includes:
a lower inorganic layer that includes a first inorganic layer, a second inorganic layer, and a third inorganic layer that are sequentially disposed on the first capping layer, the second capping layer, and the third capping layer;
an organic layer disposed on the lower inorganic layer; and
an upper inorganic layer disposed on the organic layer,
wherein a first refractive index of the first inorganic layer is about 1.5 to 1.6, a second refractive index of the second inorganic layer is about 1.7 to about 1.8, and a third refractive index of the third inorganic layer is about 1.6 to about 1.7.

3. The display device of claim 1, wherein the first thickness is about 85% of the second thickness.

4. The display device of claim 1, wherein the first thickness is about 540 angstroms to about 640 angstroms.

5. The display device of claim 1, wherein a refractive index of the first capping layer is a same as a refractive index of the second capping layer.

6. The display device of claim 5, wherein a refractive index of the first capping layer is about 2.

* * * * *